(12) United States Patent
Lhuillier

(10) Patent No.: US 10,944,065 B2
(45) Date of Patent: Mar. 9, 2021

(54) MID AND FAR-INFRARED NANOCRYSTALS BASED PHOTODETECTORS WITH ENHANCED PERFORMANCES

(71) Applicant: NEXDOT, Romainville (FR)

(72) Inventor: Emmanuel Lhuillier, Paris (FR)

(73) Assignee: NEXDOT, Romainville (FR)

( * ) Notice: Subject to any disclaimer, the term of this patent is extended or adjusted under 35 U.S.C. 154(b) by 252 days.

(21) Appl. No.: 15/746,860

(22) PCT Filed: Jul. 28, 2016

(86) PCT No.: PCT/EP2016/068106
§ 371 (c)(1),
(2) Date: Jan. 23, 2018

(87) PCT Pub. No.: WO2017/017238
PCT Pub. Date: Feb. 2, 2017

(65) Prior Publication Data
US 2020/0083469 A1    Mar. 12, 2020

(30) Foreign Application Priority Data
Jul. 28, 2015  (FR) ...................................... 1557213

(51) Int. Cl.
*H01L 29/06*         (2006.01)
*H01L 51/42*         (2006.01)
(Continued)

(52) U.S. Cl.
CPC .......... *H01L 51/426* (2013.01); *C01B 19/007* (2013.01); *C01G 11/02* (2013.01);
(Continued)

(58) Field of Classification Search
CPC ... H01L 51/426; H01L 27/307; H01L 37/025; H01L 51/0007; H01L 51/428;
(Continued)

(56) References Cited

U.S. PATENT DOCUMENTS 8,779,413 B1 *  7/2014  Landry ............... H01L 31/0376
                                                                  257/21
9,385,194 B2 *  7/2016  Cho ....................... B82Y 30/00
(Continued)

FOREIGN PATENT DOCUMENTS

JP       2014-220331 A    11/2014
KR   10-2013-0114436 A    10/2013
(Continued)

OTHER PUBLICATIONS

International Search Report, dated Sep. 7, 2016, from corresponding PCT/EP2016/068106 application.
(Continued)

*Primary Examiner* — Caleb E Henry
(74) *Attorney, Agent, or Firm* — Nixon & Vanderhye

(57) ABSTRACT

Disclosed is a plurality of metal chalcogenide nanocrystals coated with multiple organic and inorganic ligands; wherein the metal is selected from Hg, Pb, Sn, Cd, Bi, Sb or a mixture thereof; and the chalcogen is selected from S, Se, Te or a mixture thereof; wherein the multiple inorganic ligands includes at least one inorganic ligands are selected from $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof; and wherein the absorption of the C—H bonds of the organic ligands relative to the absorption of metal chalcogenide nanocrystals is lower than 50%, preferably lower than 20%.

21 Claims, 7 Drawing Sheets

(51) Int. Cl.

| | | |
|---|---|---|
| C01B 19/00 | (2006.01) | |
| C01G 11/02 | (2006.01) | |
| C01G 13/00 | (2006.01) | |
| C01G 28/00 | (2006.01) | |
| C01G 30/00 | (2006.01) | |
| G01J 5/08 | (2006.01) | |
| G01J 5/20 | (2006.01) | |
| H01L 27/30 | (2006.01) | |
| H01L 37/02 | (2006.01) | |
| H01L 51/00 | (2006.01) | |
| H01L 51/44 | (2006.01) | |

(52) U.S. Cl.
CPC ........... *C01G 13/00* (2013.01); *C01G 28/008* (2013.01); *C01G 30/008* (2013.01); *G01J 5/0853* (2013.01); *G01J 5/20* (2013.01); *H01L 27/307* (2013.01); *H01L 37/025* (2013.01); *H01L 51/0007* (2013.01); *H01L 51/428* (2013.01); *H01L 51/441* (2013.01); *C01P 2002/52* (2013.01); *C01P 2002/72* (2013.01); *C01P 2002/82* (2013.01); *C01P 2004/04* (2013.01); *C01P 2006/40* (2013.01); *H01L 2251/301* (2013.01)

(58) Field of Classification Search
CPC ............. H01L 51/441; H01L 2251/301; H01L 31/0324; H01L 31/035209; H01L 31/102; H01L 31/112; H01L 31/101; H01L 31/0256; C01B 19/007; C01G 11/02; C01G 13/00; C01G 28/008; C01G 30/008; C01P 2004/04; C01P 2006/40; C01P 2002/52; C01P 2002/72; C01P 2002/82; G01J 5/0853; G01J 5/20; Y02E 10/549; C30B 7/14; C30B 29/48; C30B 29/46
USPC .......................................................... 257/24
See application file for complete search history.

(56) References Cited

U.S. PATENT DOCUMENTS

| | | | | |
|---|---|---|---|---|
| 10,047,284 | B2* | 8/2018 | Lee | C09K 11/025 |
| 10,593,821 | B2* | 3/2020 | Korgel | H01L 31/0445 |
| 2010/0283066 | A1* | 11/2010 | Ono | H05B 33/145 |
| | | | | 257/88 |
| 2013/0146834 | A1* | 6/2013 | Cho | H01L 21/02521 |
| | | | | 257/9 |
| 2014/0054541 | A1* | 2/2014 | Chung | B82Y 40/00 |
| | | | | 257/13 |
| 2014/0209856 | A1* | 7/2014 | Landry | C09D 11/52 |
| | | | | 257/13 |
| 2014/0241977 | A1* | 8/2014 | Peng | C01B 19/002 |
| | | | | 423/509 |
| 2014/0299772 | A1* | 10/2014 | Guyot-Sionnest | H01L 31/09 |
| | | | | 250/338.4 |
| 2014/0346442 | A1* | 11/2014 | Nag | B01J 13/0034 |
| | | | | 257/29 |
| 2017/0029693 | A1* | 2/2017 | Gruhlke | C09K 11/565 |
| 2017/0043313 | A1* | 2/2017 | Abolhasani | B01J 19/185 |
| 2017/0084761 | A1* | 3/2017 | Cho | H01L 27/14647 |

FOREIGN PATENT DOCUMENTS

| | | |
|---|---|---|
| WO | 2009/127857 A1 | 10/2009 |
| WO | 2014/191083 A1 | 12/2014 |

OTHER PUBLICATIONS

Lhuillier et al., "Mid-Infrared HgTe/As2S3 Field Effect Transistors and Photodetectors," Advanced Materials, vol. 25, No. 1, Jan. 2013, pp. 137-141.

Jeong et al., "Air-Stable n-Doped Colloidal HgS Quantum Dots," Journal of Physical Chemistry Letters, vol. 5, No. 7, Mar. 2014, pp. 1139-1143.

Deng et al., "Colloidal Quantum Dots Intraband Photodetectors," ACS Nano, vol. 8, No. 11, Oct. 2014, pp. 11707-11714.

Asil, D. et al., "Role of PbSe structural stabilization in photovoltaic cells", Advanced Functional Materials, 2015, vol. 25, p. 928-935.

* cited by examiner

FIG. 7bis

MID AND FAR-INFRARED NANOCRYSTALS BASED PHOTODETECTORS WITH ENHANCED PERFORMANCES

FIELD OF INVENTION

The present invention pertains to the field of infrared imaging. Especially, the present invention relates to methods and devices in the field of mid- and far-wavelength infrared imaging at a wavelength in a range from 3 µm to 50 µm.

BACKGROUND OF INVENTION

Since the first synthesis of colloidal nanocrystal reported in the early 90's, lots of interest have been devoted to the integration of such nanocrystal into optoelectronic device. Colloidal quantum dots (CQD) offers indeed the promises to build low cost optoelectronic devices thanks to the combination of their ease of process with their stability due to their inorganic nature. Most of the efforts were focused on visible wavelength at the early stage, and the idea to use these nanomaterial for applications such as lightning and bio-imaging rapidly appeared. As the field gets mature, more material synthesis get available and in particular the synthesis of narrow band gap IV-VI compound such as lead chalcogenides became possible. Such materials were of great interest to address the absorption of the near IR range of wavelength of the sun light for photovoltaic application.

However the use of colloidal nanoparticles into optoelectronic application have to compete with existing technology such as Complementary Metal Oxide Semiconductor (CMOS) or Indium Gallium Arsenide (InGaAs) which are far more mature and already cost effective. On the other hand ultraviolet (UV) and infrared (IR) remains more pricy and technologically demanding. In the IR, the current technology (multiquantum well, HgCdTe and type II superlattices . . . ) remains high cost technology and organic electronic is inefficient for this range of wavelength.

The quest for alternative technology is far not obvious in the mid and far IR since organic materials are ineffective in this range of wavelength. There is consequently a true challenge to address the mid and far IR using colloidal nanocrystals to achieve low cost optoelectronic devices. Nanocrystals may offer some interesting properties to compete with existing technologies if they can exhibits absorption above 12 µm and higher mobility.

The goal of the current invention is to push further the optoelectronic properties of nanocrystals in two directions: (i) by demonstrating a larger range of wavelength which can be addressed with this type of material and (ii) secondly by improving their transport properties, and in particular by demonstrating higher carrier mobility. These two features together are expected to fill the gap between nanocrystals based optoelectronic devices and more mature IR dedicated semiconductor devices.

US 2014/0299772 discloses a mid-infrared photodetectors comprising HgTe nanoparticles and exhibiting an increased conductivity across the photoabsorptive layer under illumination with light at a wavelength in a range from 1.7 to 12 µm. In this patent and in Adv Mat 25, 137 (2013), the authors describe the use of HgTe CQD as infrared active material. However the transport properties and in particular the carrier mobility remain rather low (<0.1 $cm^2V^{-1}s^{-1}$), which limit the overall photoresponse of the system.

An important breakthrough in the field was the discovery of naturally self-doped CQD based on mercury chalcogenides. The self-doping of the CQD allows observing not only interband transition but also intraband transition, which tend to have a lower spacing in energy. As a consequence HgS and HgSe CQD present low energy transition without the need to external charging process, see J. Phys Chem Lett 5, 1139 (2014) and ACS Nano 8, 11707 (2014). However the described material again present low mobility (<0.01 $cm^2V^{-1}s^{-1}$), which is highly detrimental for their photo-conduction properties. Moreover the peak intraband transition remains limited below 6 µm. In the current invention we provide nanocrystals and methods for obtaining thereof, for which we can easily tune the absorption peak wavelength relative to the intraband transition from 3 to 50 µm. More over by coupling these nanocrystals with inorganic capping we achieved large mobility in thin film of nanocrystals. Mobility can be larger than 100 $cm^2V^{-1}s^{-1}$.

Compared to state of the art, the achieved mobility of the nanocrystals of the invention is typically two to three order of magnitude higher. Such an improvement directly impacts the optoelectronic properties of the material. A striking improvement is the fact that to achieve the same detection performances our material can be operated at room temperature while previous report (ACS Nano 8, 11707 (2014)) was operated in cryogenic condition (i.e. 200K below).

SUMMARY

The present invention relates to a plurality of metal chalcogenide nanocrystals coated with multiple organic and/or inorganic ligands;
wherein said metal is selected from Hg, Pb, Sn, Cd, Bi, Sb or a mixture thereof; and said chalcogen is selected from S, Se, Te or a mixture thereof;
wherein said multiple inorganic ligands comprises at least one inorganic ligands are selected from $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof; and
wherein the absorption of the organic ligands relative to the absorption of metal chalcogenide nanocrystals is lower than 50%, preferably lower than 20%.

According to one embodiment, said plurality of metal chalcogenide nanocrystals exhibits an optical absorption feature in a range from 3 µm to 50 µm and a carrier mobility not less than 1 $cm^2V^{-1}s^{-1}$.

According to one embodiment, said metal is selected from Hg or a mixture of Hg and at least one of Pb, Sn, Cd, Bi, Sb; and said chalcogen is selected from S, Se, Te or a mixture thereof; provided that said metal chalcogenide nanocrystals coated with inorganic ligands is not HgTe coated with $As_2S_3$.

The present invention also relates to a method for manufacturing the plurality of metal chalcogenide nanocrystals according to the invention, the said method comprising the following steps:
providing a metal carboxylate, preferably a metal oleate or a metal acetate in a coordinating solvent selected preferably from a primary amine more preferably oleyamine, hexadecylamine or octadecylamine;
admixing within said solution a chalcogenide precursor selected preferably from trioctylphosphine chalcogenide, trimethylsilyl chalcogenide or disulfide chalcogenide at a temperature ranging from 60° C. to 130° C.;
isolating the metal chalcogenide nanocrystals; and
coating the isolated metal chalcogenide nanocrystals with multiple inorganic ligands.

According to one embodiment, the step of isolating the metal chalcogenide nanocrystals comprises admixing a thiol and/or a phosphine with the nanocrystals; thereby forming a quenched mixture; and then extracting the nanocrystals from the quenched mixture.

According to one embodiment, the method for manufacturing colloidal metal chalcogenide nanocrystals according to the invention further comprises the step of maintaining the mixture at a temperature ranging from 60° C. to 130° C. during a predetermined duration ranging from 1 to 60 minutes after injection of the chalcogenide precursor.

According to one embodiment, said multiple inorganic ligands comprises at least one inorganic ligands are selected from $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof.

The present invention also relates to a photoconductor, photodiode or phototransistor comprising:
- a photoabsorptive layer comprising a plurality of metal chalcogenide nanocrystals according to the invention or a plurality of metal chalcogenide nanocrystals manufactured according to the invention; and
- a first plurality of electrical connections bridging the photoabsorptive layer; wherein
- the plurality of metal chalcogenide nanocrystals are positioned such that there is an increased conductivity between the electrical connections and across the photoabsorptive layer, in response to illumination of the photoabsorptive layer with light at a wavelength ranging from 3 µm to 50 µm;
- the carrier mobility is not less than 1 $cm^2V^{-1} s^{-1}$.

According to one embodiment, the photoabsorptive layer has a thickness ranging from 3 nm to 1 mm. According to one embodiment, the photoabsorptive layer has an area ranging from 100 $nm^2$ to 1 $m^2$.

The present invention also relates to a device comprising a plurality of photoconductors, photodiodes or phototransistors according to the invention and a readout circuit electrically connected to the plurality of photoconductors, photodiodes or phototransistors.

The present invention also relates to an IR-absorbing coating material comprising metal chalcogenide nanocrystals according to the invention or metal chalcogenide nanocrystals manufactured according to the invention.

The present invention also relates to a bolometer or a pyrometer comprising metal chalcogenide nanocrystals according to the invention or metal chalcogenide nanocrystals manufactured according to the invention.

The present invention also relates to a bolometer or a pyrometer comprising a plurality of metal chalcogenide nanocrystals coated with multiple organic ligands; wherein said metal is selected from Hg or a mixture of Hg and at least one of Pb, Sn, Cd, Bi, Sb; and said chalcogen is selected from S, Se, Te or a mixture thereof.

Definitions

In the present invention, the following terms have the following meanings:

As used herein the singular forms "a", "an", and "the" include plural reference unless the context clearly dictates otherwise.

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent.

"Carrier mobility" refers to both electron and hole mobility in semiconductors. The Electron and hole mobility relate the speed of each carrier as a function of the applied electric field.

"Far infrared" refers to a region of the electromagnetic spectrum corresponding to a wavelength at a range from 10 to 300 µm, a frequency from 1 to 30 THz, and photon energy from 4 to 120 meV.

"Mid-infrared" refers to a region of the electromagnetic spectrum corresponding to a wavelength at a range from 2 to 12 µm, a frequency from 24 to 150 THz, and photon energy from 100 to 621 meV.

"Nanocrystal" refers to a particle of any shape having at least one dimension in the 0.1 to 100 nanometers range.

"Shell" refers to a film or a layer of at least one atom thick covering the metal chalcogenide nanocrystal on each faces (i.e. on the entire surface except, if the growth process is performed on a substrate, on the surface in contact with said substrate).

DETAILED DESCRIPTION

According to a first aspect, this invention relates to a metal chalcogenide nanocrystal coated with inorganic ligands or a plurality of metal chalcogenide nanocrystals coated with inorganic ligands.

In one embodiment, the metal chalcogenide nanocrystal is coated with multiple organic and/or inorganic ligands.

In one embodiment, the nanocrystals of the invention are for example quantum dots, nanosheets, nanorods, nanoplatelets, nanoplates, nanoprisms, nanowalls, nanodisks, nanoparticles, nanowires, nanopowder, nanotubes, nanotetrapods, nanoribbons, nanobelts, nanowires, nanoneedles, nanocubes, nanoballs, nanocoils, nanocones, nanopillers, nanoflowers, or combination thereof.

According to one embodiment, said metal chalcogenide nanocrystal has a 0D, 1D or 2D dimension.

According to one embodiment, said metal chalcogenide nanocrystal comprises a semi-conductor selected from the group comprising or consisting of: group IV, group IIIA-VA, group IIA-VIA, group IIIA-VIA, group IA-IIIA-VIA, group IIA-VA, group IVA-VIA, group VIB-VIA, group VB-VIA, group IVB-VIA or mixtures thereof.

According to another embodiment, said metal is selected from the group comprising or consisting of: Hg, Pb, Sn, Cd, Bi, Sb or a mixture thereof.

According to another embodiment, said metal is selected from the group comprising or consisting of Hg or a mixture of Hg and at least one of Pb, Sn, Cd, Bi, Sb.

According to another embodiment, said chalcogenide is selected from the group comprising or consisting of: S, Se, Te or a mixture thereof.

According to another embodiment, said metal chalcogenide nanocrystal comprises a material selected from the group comprising or consisting of: HgS, HgSe, HgTe, $Hg_xCd_{1-x}Te$ wherein x is a real number strictly included between 0 and 1, PbS, PbSe, PbTe, $Bi_2S_3$, $Bi_2Se_3$, $Bi_2Te_3$, SnS, $SnS_2$, SnTe, SnSe, $Sb_2S_3$, $Sb_2Se_3$, $Sb_2Te_3$ and alloys and mixtures thereof.

According to another embodiment, said metal chalcogenide nanocrystal comprises a material selected from the group comprising or consisting of: HgS, HgSe, HgTe and alloys and mixtures thereof.

According to another embodiment, said metal chalcogenide nanocrystal comprises or consists of HgSe.

According to another embodiment, said metal chalcogenide nanocrystal comprises or consists of HgSeTe.

According to one embodiment, the metal chalcogenide nanocrystal comprises an additional element in minor quantities. The term "minor quantities" refers herein to quantities ranging from 0.0001% to 10% molar, preferably from 0.001% to 10% molar.

According to one embodiment, the metal chalcogenide nanocrystal comprises a transition metal or a lanthanide in minor quantities. The term "minor quantities" refers herein to quantities ranging from 0.0001% to 10% molar, preferably from 0.001% to 10% molar.

According to one embodiment, the metal chalcogenide nanocrystal comprises in minor quantities an element inducing an excess or a defect of electrons compared to the sole nanocrystal. The term "minor quantities" refers herein to quantities ranging from 0.0001% to 10% molar, preferably from 0.001% to 10% molar.

According to one embodiment, the metal chalcogenide nanocrystal comprises in minor quantities an element inducing a modification of the optical properties compared to the sole nanocrystal. The term "minor quantities" refers herein to quantities ranging from 0.0001% to 10% molar, preferably from 0.001% to 10% molar.

According to one embodiment, the metal chalcogenide nanocrystal comprises or consists of a core/shell structure known by one skilled in the art or a core/shell according to the present invention. According to one embodiment, the "core" can have an overcoating or shell on the surface of its core.

According to one embodiment, the metal chalcogenide nanocrystal have a core shell structure and the shell is made of CdS, CdSe, PbS, PbSe, PbTe, ZnO, ZnS, ZnSe.

According to another embodiment, the metal chalcogenide nanocrystal has a size ranging from 0.3 nm and 10 µm, more preferably between 1 nm to 1 µm, more preferably between 3 nm and 100 nm and even more preferably from 5 nm to 50 nm.

According to one embodiment, the thickness of the shell is ranging from 0.2 nm to 10 mm, from 0.2 nm to 1 mm, from 0.2 nm to 100 µm, from 0.2 nm to 10 µm, from 0.2 nm to 1 µm, from 0.2 nm to 500 nm, from 0.2 nm to 250 nm, from 0.2 nm to 100 nm, from 0.2 nm to 50 nm, from 0.2 nm to 25 nm, from 0.2 nm to 20 nm, from 0.2 nm to 15 nm, from 0.2 nm to 10 nm or from 0.2 nm to 5 nm.

According to another embodiment, said metal chalcogenide nanocrystal is a hetero-structure comprising or consisting of different semiconductors.

According to one embodiment, said metal chalcogenide nanocrystal is an intrinsic semiconductor or undoped semiconductor.

According to another embodiment, said metal chalcogenide nanocrystal is an extrinsic semiconductor or doped semiconductor.

According to one embodiment, the doping is induced by surface effect.

According to one embodiment, the doping is induced by the reduction of the metal chalcogenide nanocrystal by its environment.

According to one embodiment, the doping is induced by the reduction of the metal chalcogenide nanocrystal by water.

According to one embodiment, the doping of the metal chalcogenide nanocrystal is a n-type doping.

According to one embodiment, the metal chalcogenide nanocrystal is doped by electrochemistry.

According to one embodiment, the doping magnitude can be controlled by changing the capping ligands, see FIG. 7b.

According to one embodiment, the doping magnitude depends on the surface dipole associated with the molecule at the metal chalcogenide nanocrystal surface.

According to another embodiment, the doping is induced by non-stoichiometry of said metal chalcogenide nanocrystal.

According to another embodiment, the doping is induced by impurity or impurities.

According to another embodiment, the metal chalcogenide nanocrystal has a cation rich surface.

According to another embodiment, the metal chalcogenide nanocrystal has an anion rich surface.

According to another embodiment, the metal chalcogenide nanocrystal is doped.

According to another embodiment, the doping of the metal chalcogenide nanocrystal is between 0 and 2 electrons per nanocrystal.

According to another embodiment of the invention, each the metal chalcogenide nanocrystal include less than 100 dopants and more preferably less than 10 dopants per nanocrystal.

According to another embodiment, the metal chalcogenide nanocrystal may be further surrounded by organic ligand such as amine, thiol, carboxylic acid, phosphine, phosphine oxide.

According to another embodiment, the metal chalcogenide nanocrystal may be coated with amine such as oleylamine, dodecylamine, octadecylamine, tetradecylamine, octylamine, aniline, heptadiamine, butylamine, propylamine.

According to another embodiment, the metal chalcogenide nanocrystal may be coated with thiol such as dodecanethiol, octadecanethiol, octanethiol, decanethiol, ethanedithiol.

According to another embodiment, the metal chalcogenide nanocrystal may be coated with carboxylic acid such as oleic acid, myristic acid, stearic acid, arachidic acid. Decanoic acid, butyric acid, ethanoic acid, methanoic acid.

According to another embodiment, the metal chalcogenide nanocrystal may be coated with phosphine such as trioctyl phosphine, tributyl phosphine, phenyl phosphine, diphenyl phosphine.

According to another embodiment, the metal chalcogenide nanocrystal may be coated with phosphine oxide such as trioctyl phosphine oxide.

According to another embodiment, the organic ligand density of the nanocrystal surface ranging from 0.01 ligand·nm$^{-2}$ to 100 ligands·nm$^{-2}$ and more preferably from 0.1 ligand·nm$^{-2}$ to 10 ligands·nm$^{-2}$.

According to an embodiment, the metal chalcogenide nanocrystal of the invention is coated with inorganic ligands.

According to one embodiment, the inorganic ligand is selected from the group comprising or consisting of: $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $As_2Se_3$, $Sb_2S_3$, $As_2Te_3$, $Sb_2S_3$, $Sb_2Se_3$, $Sb_2Te_3$ or a mixture thereof.

According to one embodiment, the inorganic ligand is preferably $AS_2Se_3$, $S^{2-}$, $HS^-$.

According to one embodiment, the inorganic ligand is preferably $AS_2Se_3$.

According to another embodiment, the inorganic ligand density of the nanocrystal surface ranging from 0.01 ligand·nm$^{-2}$ to 100 ligands·nm$^{-2}$ and more preferably from 0.1 ligand·nm$^{-2}$ to 10 ligands·nm$^{-2}$.

According to one embodiment, the ratio between organic ligands and inorganic ligands of the nanocrystal surface is ranging from 0.001 to 0.25, preferably from 0.001 to 0.2, more preferably from 0.001 to 0.1 or even more preferably from 0.001 to 0.01.

According to another embodiment, the metal chalcogenide nanocrystal does not comprise or consist in HgTe coated with $As_2S_3$.

According to another embodiment, the metal chalcogenide nanocrystal does not comprise or consist in PbS.

According to another embodiment, the metal chalcogenide nanocrystal does not comprise or consist in PbSe.

According to another embodiment, the metal chalcogenide nanocrystal is HgS.

According to another embodiment, the metal chalcogenide nanocrystal is HgSe. According to another embodiment, the metal chalcogenide nanocrystal is HgSeTe. According to another embodiment, the metal chalcogenide nanocrystal is SnTe, $SnS_2$, SnS, $Bi_2S_3$, $Bi_2Te_3$, $Bi_2Se_3$, $Sb_2S_3$, $Sb_2Se_3$, $Sb_2Te_3$.

According to one an embodiment, the metal chalcogenide nanocrystal has optical absorption features in the visible, near IR, mid IR, far IR.

According to another embodiment, the metal chalcogenide nanocrystal has optical absorption features coming from interband transition.

According to another embodiment, the metal chalcogenide nanocrystal has optical absorption features coming from intraband transition.

According to another embodiment, the metal chalcogenide nanocrystal has optical absorption features coming from plasmonic effect.

According to another embodiment, the metal chalcogenide nanocrystal has optical absorption features from 400 nm to 50 µm, preferably from 0.8 µm to 25 µm and more preferably from 1 µm to 20 µm.

According to another embodiment, the metal chalcogenide nanocrystal has optical absorption features from 3 µm to 50 µm.

According to another embodiment, the metal chalcogenide nanocrystal has optical absorption features from 1 µm to 3 µm.

According to another embodiment, the metal chalcogenide nanocrystal has optical absorption features from 3 µm to 5 µm.

According to another embodiment, the metal chalcogenide nanocrystal has optical absorption features from 3 µm to 8 µm.

According to another embodiment, the metal chalcogenide nanocrystal has optical absorption features from 8 µm to 15 µm.

According to another embodiment, the metal chalcogenide nanocrystal has optical absorption features from 8 µm to 12 µm.

According to another embodiment, the metal chalcogenide nanocrystal has optical absorption features above 12 µm.

According to another embodiment, the metal chalcogenide nanocrystal has optical absorption features above 15 µm.

According to another embodiment, the metal chalcogenide nanocrystal has optical absorption depth from 1 nm to 100 µm and more preferably from 100 nm to 10 µm.

According to another embodiment of the invention, the plurality of metal chalcogenide nanocrystals has an absorption coefficient ranging from 100 $cm^{-1}$ to $5 \times 10^5$ $cm^{-1}$ at the first optical feature and more preferably from 500 $cm^{-1}$ to $10^5$ $cm^{-1}$ and even more preferably from 1000 $cm^{-1}$ to $10^4$ $cm^{-1}$.

According to a second aspect, this invention relates to a plurality of metal chalcogenide nanocrystals, wherein said plurality of metal chalcogenide nanocrystals exhibits a photoluminescence peak at a wavelength in a range from 3 µm to 50 µm and a carrier mobility not less than 1 $cm^2V^{-1}$ $s^{-1}$; said metal is selected from Hg, Pb, Sn, Cd, Bi or Sb and said chalcogen is selected from S, Se or Te.

According to one embodiment, the plurality of metal chalcogenide nanocrystals exhibit a optical absorption peak at a wavelength in a range from 1 µm to 2, 3, 4, 5, 6, 7, 8, 9, 10, 11, 12, 13, 14, 15, 16, 17, 18, 19, 20, 21, 22, 23, 24, 25, 26 27, 28, 29 30, 31, 32, 33, 34, 35, 36, 37, 38, 39, 40, 41, 42, 43, 44, 45, 46, 47, 48, 49, 50 µm.

According to one embodiment, the width at half maximum of the absorption peak in the mid or far IR is less than 50% in energy of the intraband peak, preferably less 20% in energy of the intraband peak, preferably less than 10% in energy of the intraband peak and even more preferably less than 5% in energy of the intraband peak.

According to one embodiment, the width at half maximum of the absorption peak in the mid or far IR is less 2000 $cm^{-1}$, preferably less than 1000 $cm^{-1}$, and even more preferably less than 500 $cm^{-1}$.

According to one embodiment, the width at half maximum of the absorption peak in the mid or far IR is less 200 meV, preferably less than 100 meV, and even more preferably less than 50 meV.

According to one embodiment, the plurality of metal chalcogenide nanocrystals exhibit a photoluminescence peak at a wavelength in a range from 1 µm to 2, 3, 4, 5, 6, 7, 8, 9, 10, 11, 12, 13, 14, 15, 16, 17, 18, 19, 20, 21, 22, 23, 24, 25, 26 27, 28, 29 30, 31, 32, 33, 34, 35, 36, 37, 38, 39, 40, 41, 42, 43, 44, 45, 46, 47, 48, 49, 50 µm.

According to another embodiment, the metal chalcogenide nanocrystal is further surrounded by ligand such as amine, thiol, carboxylic acid, phosphine, phosphine oxide.

According to another embodiment, the metal chalcogenide nanocrystal is surrounded by inorganic ligand selected in the group comprising or consisting of: $S^{2-}$, $HS^-$ or $As_2S_3$.

According to another embodiment, the metal chalcogenide nanocrystal may be further surrounded by inorganic ligand selected in the group comprising or consisting of: $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof.

According to another embodiment, the metal chalcogenide nanocrystal may be further surrounded by inorganic ligand selected in the group comprising or consisting of: CdSe, CdTe $SnS_2$, $AsS^{3+}$, $LiS_2$, $FeS_2$, $Cu_2S$ or a mixture thereof.

According to another embodiment, the ligand exchange procedure to remove the initial organic ligand and cap the nanocrystal with the new inorganic ones is made using a solid state approach.

According to another embodiment, the ligand exchange procedure to remove the initial organic ligand and cap the nanocrystal with the new inorganic ones is made using a liquid phase approach.

According to another embodiment, the ligand exchange procedure to remove the initial organic ligand and cap the nanocrystal with the new inorganic ones is made using a liquid phase transfer method.

According to another embodiment, the ligand exchange procedure to remove the initial organic ligand and cap the nanocrystal with the new inorganic ones while the new surface chemistry is brought to the nanocrystal under a gas form.

According to an embodiment, the ligand exchange procedure comes with a reduction of the absorption relative to the organic ligands initially at the nanocrystal surface, especially a reduction of the absorption relative to the C—H bond of the organic ligands.

According to an embodiment, the ligand exchange leads to a reduction of the absorption relative to the organic ligands which is higher than 50% of the absorption of the metal chalcogenide nanocrystals, preferably higher than 60%, 70%, 75%, 80%, 90% or 95% of the absorption of the metal chalcogenide nanocrystals.

According to an embodiment, the ligand exchange leads to a reduction of the absorption relative to the organic ligands which is higher than 50% of the absorption of the interband peak or the intraband peak of metal chalcogenide nanocrystals, preferably higher than 60%, 70%, 75%, 80%, 90% or 95% of the absorption of the interband peak or the intraband peak of metal chalcogenide nanocrystals.

According to one embodiment, the absorption of the organic ligands relative to the absorption of metal chalcogenide nanocrystals is lower than 50%, preferably lower than 40%, 30%, 25%, 20%, 10% or 5%.

According to one embodiment, the absorption of the organic ligands relative to the absorption of the interband peak or the intraband peak of metal chalcogenide nanocrystals is lower than 50%, preferably lower than 40%, 30%, 25%, 20%, 10% or 5%.

According to one embodiment wherein the metal chalcogenide nanocrystal is doped or self-doped, such as for instance for HgSe or HgS, the ligand exchange leads to a reduction of the absorption relative to the organic ligands which is higher than 50% of the absorption of the intraband peak of metal chalcogenide nanocrystals, preferably higher than 60%, 70%, 75%, 80%, 90% or 95% of the absorption of the intraband peak of metal chalcogenide nanocrystals.

According to one embodiment wherein the metal chalcogenide nanocrystal is doped or self-doped, such as for instance for HgSe or HgS, the absorption of the organic ligands relative to the absorption of the intraband peak of metal chalcogenide nanocrystals is lower than 50%, preferably lower than 40%, 30%, 25%, 20%, 10% or 5%.

According to one embodiment wherein the metal chalcogenide nanocrystal is non-doped, such as for instance for HgTe, PbTe, PbSe or PbS, the ligand exchange leads to a reduction of the absorption relative to the organic ligands which is higher than 50% of the absorption of the interband peak of metal chalcogenide nanocrystals, preferably higher than 60%, 70%, 75%, 80%, 90% or 95% of the absorption of the interband peak of metal chalcogenide nanocrystals.

According to one embodiment wherein the metal chalcogenide nanocrystal is non-doped, such as for instance for HgTe, PbTe, PbSe or PbS, the absorption of the organic ligands relative to the absorption of the interband peak of metal chalcogenide nanocrystals is lower than 50%, preferably lower than 40%, 30%, 25%, 20%, 10% or 5%.

According to one embodiment, the absorption of the organic ligands refers herein to the absorption of the C—H bonds of the organic ligands.

According to an embodiment, the organic ligands absorption, especially the C—H absorption, in optical density is weaker than the absorption relative to the intraband feature of the nanocrystal.

According to an embodiment, the ratio of the organic ligands absorption, especially the C—H absorption, relative to the absorption of the intraband feature of the nanocrystal is less than 1, preferably less than 50%, more preferably less than 20% and even more preferably less than 10%.

According to a third aspect, the present invention relates to a method for manufacturing the metal chalcogenides nanocrystals disclosed herein.

According to one embodiment, the method for manufacturing the metal chalcogenide nanocrystals comprises:

providing a metal carboxylate, preferably a metal oleate or a metal acetate, in a coordinating solvent selected from a primary amine selected from the group comprising or consisting of: oleylamine, hexadecylamine or octadecylamine;

admixing within the solution a chalcogenide precursor selected from the group comprising or consisting of: trioctylphosphine chalcogenide, trimethylsilyl chalcogenide or disulfide chalcogenide at a temperature ranging from 60° C. to 130° C.; and, isolating the metal chalcogenide nanocrystals; wherein said metal is selected from Hg, Pb, Sn, Cd, Bi, Sb or a mixture thereof and said chalcogenide is selected from S, Se, Te or a mixture thereof.

According to one embodiment, the method for manufacturing the metal chalcogenides nanocrystals is performed at a temperature between 0° C. and 350° C., More preferably between 80° C. and 250° C. and even more preferably between 60° C. and 130° C.

According to one embodiment, the step of isolating the metal chalcogenide nanocrystals comprises admixing a thiol and/or a phosphine with the nanocrystals; thereby forming a quenched mixture; and then extracting the nanocrystals from the quenched mixture.

According to one embodiment, the mixture with the chalcogenide precursor is maintained at a temperature ranging from 60° C. to 130° C. during a predetermined duration ranging from 1 to 60 minutes after injection of the chalcogenide precursor.

According to one embodiment, the method for manufacturing the metal chalcogenide nanocrystals as described above further comprises the step of coating the isolated metal chalcogenide nanocrystals with ligands selected from amine, thiol, carboxylic acid, phosphine, phosphine oxide, $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof.

According to another embodiment, the method for manufacturing the metal chalcogenide nanocrystals as described above further comprises the step of coating the isolated metal chalcogenide nanocrystals with ligands selected from CdSe, CdTe SnS$_2$, AsS$^{3+}$, LiS$_2$, FeS$_2$, Cu$_2$S or a mixture thereof.

According to another embodiment, the method for manufacturing the metal chalcogenides nanocrystals is performed in a three neck flask which volume is from 10 mL to 100 L and preferably from 50 mL to 250 mL.

According to another embodiment, the method for manufacturing the metal chalcogenides nanocrystals is performed in an automated setup which volume is between 10 mL and 100 L, preferably between 250 ml and 50 L and more preferably between 1 L and 30 L.

According to another embodiment, the method for manufacturing the metal chalcogenides nanocrystals is a continuous flow reactor.

According to one embodiment, the method for manufacturing the metal chalcogenides nanocrystals comprises the use of a coordinating solvent such as oleylamine, hexadecylamine or octadecylamine.

According to one embodiment, the method for manufacturing the metal chalcogenides nanocrystals wherein the chalcogen is Se comprises the injection at high temperature of selenium precursor such as TOPSe, Se powder, SeS$_2$, and selenourea.

In one embodiment, selenourea is not used as a Se source.

According to one embodiment, the method for manufacturing the metal chalcogenides nanocrystals wherein the metal is Hg comprises using mercury carboxylatye as the mercury source.

According to one embodiment, the method for manufacturing the metal chalcogenides nanocrystals HgSe comprises using mercury oleate as the mercury source.

According to one embodiment, the method for manufacturing the metal chalcogenides nanocrystals HgSe comprises injecting the precursor in a stoichiometric ratio.

According to one embodiment, the method for manufacturing the metal chalcogenides nanocrystals HgSe comprises injecting the Hg precursor in excess compared to Se by a factor not exceeding 10 times, and more preferably 3 times.

According to one embodiment, the method for manufacturing the metal chalcogenides nanocrystals HgSe comprises injecting the Se precursor in excess compared to Hg by a factor not exceeding 10 times, and more preferably 3 times.

According to a fourth aspect, the present invention relates to photoconductors, photodiodes or phototransistors.

According to one embodiment, the plurality of metal chalcogenide nanocrystal is for use in a transistor, conductor or diode, preferably a phototransistor, a photoconductor or a photodiode.

According to another embodiment, the photoconductor, phototransistor or photodiode can be selected in the group of a charge-coupled device (CCD), a luminescent probe, a laser, a thermal imager, a night-vision system and a photodetector.

According to another embodiment, the plurality of metal chalcogenide nanocrystal is for use in a transistor, conductor or diode with high mobility.

According to another embodiment, the transistor, conductor or diode of the invention is for use in a transistor, conductor or diode with mobility higher than 1 cm$^2$V$^{-1}$ s$^{-1}$, preferably higher than 5 cm$^2$V$^{-1}$ s$^{-1}$, and even more preferably higher than 10 cm$^2$V$^{-1}$ s$^{-1}$.

According to one embodiment, the transistor, conductor or diode of the invention comprises a first cathode layer, the cathode layer being electronically coupled to a first photoabsorptive layer comprising a plurality of metal chalcogenide nanocrystals as described here above or a plurality of metal chalcogenide nanocrystals manufactured according to the method as described here above, the first photoabsorptive layer being coupled to a first anode layer.

According to one embodiment, the photoconductor, photodiode or phototransistor comprises:
a photoabsorptive layer or film comprising a plurality of metal chalcogenide nanocrystals as described here above or a plurality of metal chalcogenide nanocrystals manufactured according to the method as described here above; and
a first plurality of electrical connections bridging the photoabsorptive layer;
wherein
the plurality of metal chalcogenide nanocrystals are positioned such that there is an increased conductivity between the electrical connections and across the photoabsorptive layer, in response to illumination of the photoabsortive layer with light at a wavelength ranging from 3 µm to 50 µm;
the carrier mobility is not less than 1 cm$^2$V$^{-1}$ s$^{-1}$.

According to one embodiment, the photoabsorptive layer or film has a thickness from 3 nm to 1 mm, more preferably from 10 nm to 10 µm and more preferably from 30 nm to 1 µm.

According to another embodiment, the photoabsorptive layer or film has a thickness from 10 nm to 50 µm, from 0.05 µm to 25 µm, from 0.1 µm to 12.5 µm or from 0.5 µm to 10 µm.

According to another embodiment, the photoabsorptive layer or film has an area from 100 nm$^2$ to 1 m$^2$, preferably from 1 µm$^2$ to 10 cm$^2$ and more preferably from 50 µm$^2$ to 1 cm$^2$.

According to another embodiment of the invention, the photoabsorptive layer or film is prepared by dropcasting, dipcoating, spincoating, electrophoretic deposition.

According to another embodiment of the invention, the photoabsorptive layer or film is further protected by a capping layer.

According to another embodiment of the invention, the capping layer is an inorganic layer.

According to another embodiment of the invention, the photoabsorptive layer or film is protected by an inorganic layer comprising or consisting of ZnO, ZnS, ZnSe, Al$_2$O$_3$, SiO$_2$, MgO, As$_2$S$_3$, As$_2$Se$_3$.

According to another embodiment of the invention, the photoabsorptive layer or film is protected by a polymer layer such as for instance a silicon based polymer, PET or PVA.

According to another embodiment of the invention, the photoabsorptive layer or film is protected by an inorganic layer deposited by atomic layer deposition.

According to another embodiment of the invention, the photoabsorptive layer or film is protected by an inorganic layer deposited by chemical bath deposition.

According to another embodiment of the invention, the photoabsorptive layer or film is protected by an O$_2$ insulating layer.

According to another embodiment of the invention, the photoabsorptive layer or film is protected by a H$_2$O insulating layer.

According to another embodiment of the invention, the photoabsorptive layer or film is protected by a layer which role is the thermal management of the nanoparticle temperature.

According to another embodiment of the invention, the photoabsorptive layer or film has an absorption coefficient ranging from 100 cm$^{-1}$ to 5×10$^5$ cm$^{-1}$ at the first optical feature and more preferably from 500 cm$^{-1}$ to 10$^5$ cm$^{-1}$ and even more preferably from 1000 cm$^1$ to 10$^4$ cm$^{-1}$.

According to another embodiment of the invention, the carrier mobility is not less than 1 cm$^2$V$^{-1}$ s$^{-1}$, preferably more than 10 cm$^2$V$^{-1}$ s$^{-1}$ and even more preferably higher than 50 cm$^2$V$^{-1}$ s$^{-1}$.

According to an embodiment, the photoabsorptive layer or film is connected to at least two electrodes.

According to an embodiment, the photoabsorptive layer or film is connected to three electrodes, wherein one of them is used as a gate electrode.

According to an embodiment, the photoabsorptive layer or film is connected to an array of electrodes.

According to one embodiment, the photoabsorptive layer or film exhibits a spectrum which is tuned by electrochemistry.

According to one embodiment, the photoabsorptive layer or film exhibits an infrared spectrum which is tuned by changing the surface chemistry.

According to another embodiment, the photodetector is for use as a flame detector.

According to another embodiment, the photodetector allows bicolor detection.

According to another embodiment, the built detector allows bicolor detection and one of the wavelength is centered around the $CO_2$ absorption at 4.2 µm.

According to another embodiment, the photodetector allows bicolor detection and one of the wavelength is centered around the CH absorption at 3.3 µm.

According to another embodiment, the photodetector allows bicolor detection and one of the wavelength is centered around the $H_2O$ absorption at 3 µm.

According to another embodiment, the photodetector allows bicolor detection and one of the wavelength is centered from 3 µm to 4.2 µm.

According to another embodiment, the photodetector allows bicolor detection and one of the wavelength is centered around 1.3 µm.

According to another embodiment, the photodetector allows bicolor detection and one of the wavelength is centered around 1.55 µm.

According to another embodiment, the photodetector allows bicolor detection and one of the wavelength is centered from 3 µm to 5 µm.

According to another embodiment, the photodetector allows bicolor detection and one of the wavelength is centered from 8 µm to 12 µm.

According to another embodiment, the photodetector allows multicolor detection.

According to another embodiment, the photoabsorptive layer or film of the invention is used as the absorbing layer of an infrared camera.

The present invention also relates to a device comprising a plurality of photoconductors, photodiodes or phototransistors according to the invention and a readout circuit electrically connected to the plurality of photoconductors, photodiodes or phototransistors.

According to a fifth aspect, the present invention relates to a single pixel device.

According to one embodiment, the metal chalcogenide nanocrystal of the invention is processed under a matrix form.

According to another embodiment, the metal chalcogenide nanocrystal of the invention is processed to design several pixels.

According to another embodiment, the metal chalcogenide nanocrystal of the invention is processed to design at least 2, 3, 4, 5 pixels.

According to another embodiment, the metal chalcogenide nanocrystal of the invention is processed to design an array of pixels.

According to another embodiment, the pixel consisting of the metal chalcogenide nanocrystal of the invention forms a 1D (line) detector.

According to another embodiment, the pixel consisting of the metal chalcogenide nanocrystal of the invention forms a 2D (line) detector.

According to another embodiment, an array of pixel of the invention includes at least 50×50 pixels, or 256×256 pixels or 512×512 pixels or 1024×1024 pixels.

According to another embodiment, the array of pixel of the invention is a megapixel matrix.

According to another embodiment, the array of pixel of the invention contains more than one megapixel, preferably more than 2, 4, 8, 16, 32 or 64 megapixels.

According to another embodiment, the array of pixel has a filling factor higher than 40% (i.e. more than 40% of the area of the total matric is made of pixel), more preferably higher than 50%; more preferably higher than 60%, more preferably higher than 70%, more preferably higher than 80%, and even more preferably higher than 90%.

According to another embodiment, the spacing between the pixels is less than the pixel size, preferably less than 50% of the pixel size, more preferably less than 20% of the pixel size.

According to another embodiment, the pixel are connected to a read out circuit.

According to another embodiment, the pixel are connected to a read out circuit in a planar geometry.

According to another embodiment, the pixel are connected to a read out circuit in a vertical geometry.

According to another embodiment, the pixel size is included between 1 nm and 10 cm, preferably between 100 nm and 1 mm and even more preferably between 1 µm and mm.

According to a sixth aspect, the present invention relates to an IR-absorbing coating.

According to one embodiment, the present invention relates to a layer comprising or consisting of the IR-absorbing coating, thus forming a narrow band gap absorbing layer.

According to another embodiment of the invention, the layer comprising the IR-absorbing coating sensitizes another material for infrared absorption.

According to another embodiment of the invention, the layer comprising the IR-absorbing coating enhances the infrared absorption of a bolometer device.

The present invention also relates to a bolometer or a pyrometer comprising an IR-absorbing coating comprising a plurality of metal chalcogenide nanocrystals according to the invention.

According to one embodiment, the bolometer or pyrometer comprises a plurality of metal chalcogenide nanocrystals coated with multiple organic ligands; wherein said metal is selected from Hg or a mixture of Hg and at least one of Pb, Sn, Cd, Bi, Sb; and said chalcogen is selected from S, Se, Te or a mixture thereof. According to one embodiment, said coating comprises or consist of organic ligands.

According to one embodiment, the narrow band gap absorbing layer is not directly connected to the metal electrodes.

According to another embodiment, the narrow band gap absorbing layer is spaced from the metal electrodes by a unipolar barrier.

According to another embodiment, a unipolar barrier is used to reduce the dark current.

According to another embodiment, a unipolar barrier is used to reduce the majority carrier current.

According to another embodiment, the used unipolar barrier to reduce the dark current is a hole blocking layer.

According to another embodiment, the used unipolar barrier to reduce the dark current is an electron blocking layer.

According to one embodiment, the layer comprising the IR-absorbing coating is connected to a read out circuit.

According to another embodiment of the invention, the layer comprising the IR-absorbing coating is cooled down by a Peltier device.

According to another embodiment of the invention, the layer comprising the IR-absorbing coating is cooled down by a cryogenic cooler.

According to another embodiment of the invention, the layer comprising the IR-absorbing coating is cooled down using liquid nitrogen.

According to another embodiment of the invention, the layer comprising the IR-absorbing coating is cooled down using liquid helium.

According to another embodiment of the invention, the layer comprising the IR-absorbing coating is operated from 1.5K to 350K, more preferably from 4K to 310K and even more preferably from 70K to 300K.

According to another embodiment of the invention, the layer comprising the IR-absorbing coating is illuminated by the front side.

According to another embodiment of the invention, the layer comprising the IR-absorbing coating is illuminated by the back side (through a transparent substrate).

According to another embodiment of the invention, the layer comprising the IR-absorbing coating is used as infrared emitting layer.

According to another embodiment of the invention, the layer comprising the IR-absorbing coating has a photo response from 1 $\mu A \cdot W^{-1}$ to 1 $kA \cdot W^{-1}$ and more preferably from 1 $mA \cdot W^{-1}$ to 50 $A \cdot W^{-1}$ and even more preferably from 10 $mA \cdot W^{-1}$ to 10 $A \cdot W^{-1}$.

According to another embodiment of the invention, the layer comprising the IR-absorbing coating has a noise current density limited by 1/f noise.

According to another embodiment of the invention, the layer comprising the IR-absorbing coating has a noise current density limited by Johnson noise.

According to another embodiment of the invention, the layer comprising the IR-absorbing coating has a specific detectivity from $10^6$ to $10^{14}$ jones, more preferably from $10^7$ to $10^{13}$ jones and even more preferably from $10^8$ to $5 \times 10^{12}$ jones.

According to another embodiment of the invention, the layer comprising the IR-absorbing coating has a bandwidth higher than 1 Hz, more preferably higher than 10 Hz, more preferably higher than 100 Hz, even more preferably higher than 1 kHz.

According to another embodiment of the invention, the time response of the photoabsorptive layer or film under a pulse of light is smaller than 1 ms, preferably smaller than 100 µs, more preferably smaller than 10 µs and even more preferably smaller than 1 µs.

According to another embodiment of the invention, the time response of the photoabsorptive layer or film under a pulse of light is smaller than 1 µs, preferably smaller than 100 ns, more preferably smaller than 10 ns and even more preferably smaller than 1 ns.

According to another embodiment of the invention, the time response of the photoabsorptive layer or film under a pulse of light is smaller than 1 ns, preferably smaller than 100 ps, more preferably smaller than 10 ps and even more preferably smaller than 1 ps.

According to another embodiment of the invention, the magnitude and sign of the photoresponse of the photoabsorptive layer or film is tuned or controlled by a gate bias According to another embodiment of the invention, the magnitude and sign of the photoresponse of the photoabsorptive layer or film is tuned with the incident wavelength of the light.

According to another embodiment of the invention, the time response of the device is fastened by reducing the spacing between electrodes.

According to another embodiment of the invention, the time response of the device is fastened by using a nanotrench geometry compared to µm spaced electrodes.

According to another embodiment of the invention, the time response of the photoconductor, photodiode or phototransistor is tuned or controlled with a gate bias.

According to another embodiment of the invention, the time response of the photoconductor, photodiode or phototransistor depends on the incident wavelength of the light.

According to another embodiment of the invention, the time response of the photoconductor, photodiode or phototransistor is smaller than 1 s, preferably smaller than 100 ms, more preferably smaller than 10 ms and even more preferably smaller than 1 ms.

According to another embodiment, the magnitude, sign and duration of the photoresponse of the photodetector is tuned or controlled by a gate bias.

According to another embodiment, the magnitude, sign and duration of the photoresponse of the photodetector depends on the incident wavelength.

BRIEF DESCRIPTION OF THE DRAWINGS

FIG. 7bis a—infrared spectrum of HgSe CQD after ligand exchange with different ligands; b—population of the conduction band is state as a function of the surface dipole magnitude for different surface capping ligands.

EXAMPLES

The present invention is further illustrated by the following examples.

Example 1: HgSe Nanocrystal Synthesis—2 Step Synthesis

Figure 1:
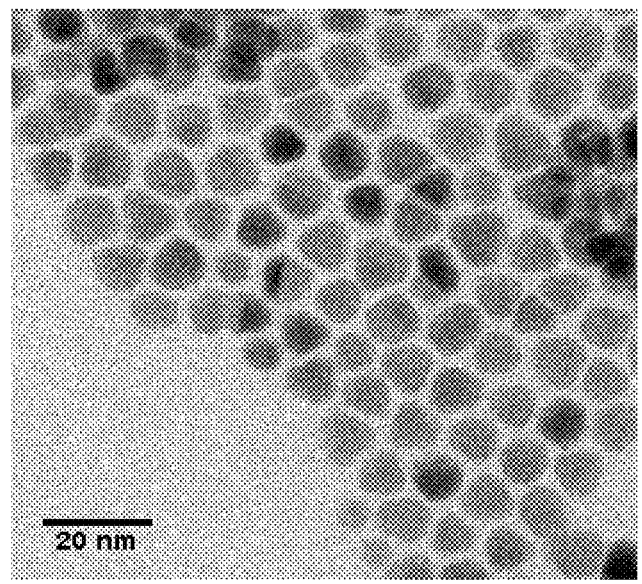
FIG. 1 represents an image of the transmission electron microscopy of small HgSe QD.
Figure 3:
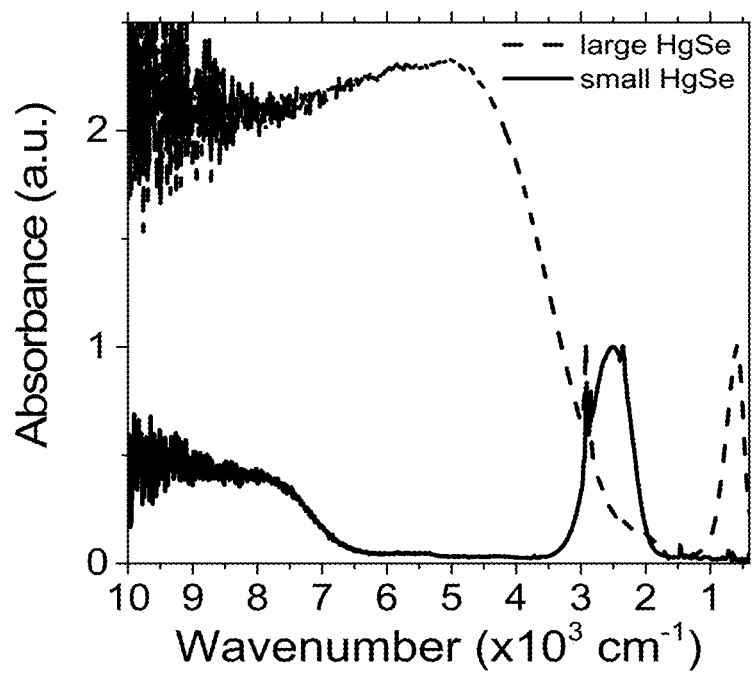
FIG. 3 represents an infrared absorption spectrum of small and large HgSe QD.
Figure 4:
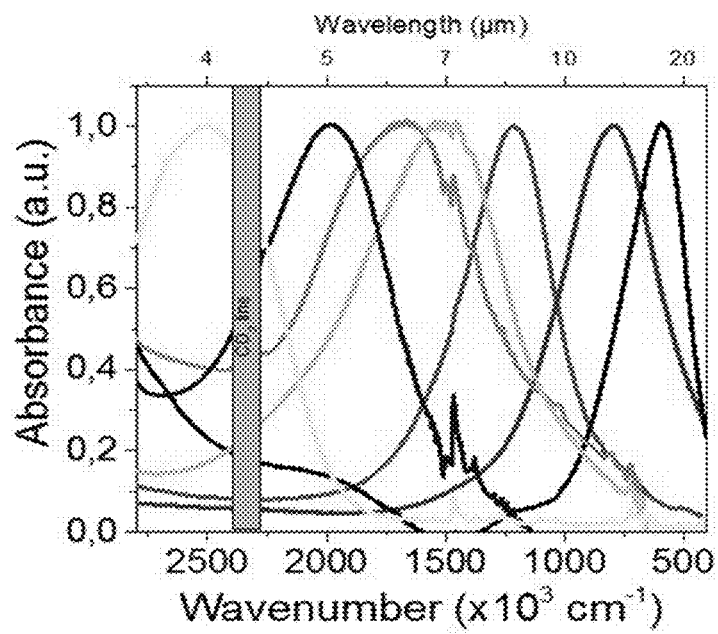
FIG. 4 represents the absorbance spectrum of small and large HgSe QD of different size. The range of wavelength is selected to highlight the intraband transition.
Figure 5:
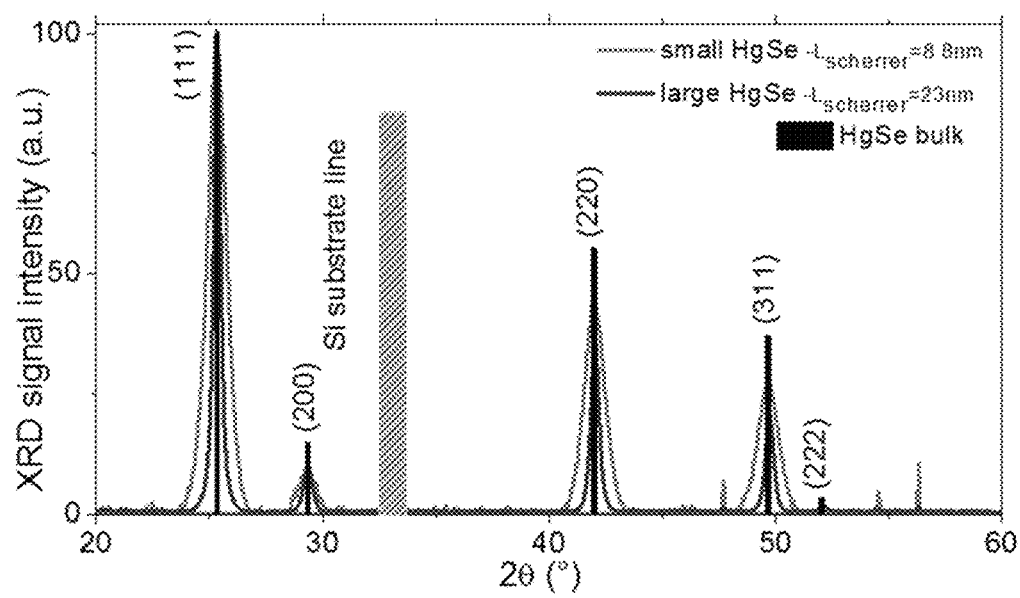
FIG. 5 represents the XRD diffractogramm of HgSe CQD.

In a 50 mL three necks flask, 2 g of mercury acetate $(Hg(OAc)_2)$ and 80 mL of oleic acid are degassed at 85° C.

under vacuum for 30 min. the obtained stock solution is transparent yellowish. 4 mL of this solution are mixed with 10 mL of oleylamine and degassed at 85° C. for 30 min. Meanwhile 1.58 g of Se powder is dissolved by sonication in 20 mL of trioctylphosphine (TOPSe). The final solution is clear and transparent. Under Ar at a temperature between 60 and 130° C., 1 mL of TOPSe is injected in the flask containing the Hg precursor. The mixture immediately turns dark; the reaction is performed for 30 s to 60 min. Then 1 mL of dodecanethiol is injected to quench the reaction and the flask quickly cooled down using fresh air flow. The content of the flask was split into 50 mL tube and ethanol is added to precipitate the nanoparticle. After centrifugation for 5 min at 5000 rpm, the clear supernatant is trashed and the pellet redissolved in 10 mL clear toluene. This cleaning procedure is repeated for a second time using ethanol as non-solvent and toluene as good solvent. The pellet is again redissolved in toluene and 3 mL of acetone is added before centrifuging the solution. The formed pellet is saved and dried under nitrogen flow before being redissolved in toluene. 5 mL of ethanol is added to the supernatant which is further centrifuged to form a second pellet. The latter is also dried and redissolved in toluene. Finally 20 mL of ethanol is used to precipitate the remaining nanocrystal into the supernatant and the third fraction is further processed like the first two ones. The obtained nanocrystals are less than 10 nm in size, see FIG. 1 and have optical feature ranging from 3 to 7 µm (at the intraband exciton peak, see FIGS. 3 and 4). Their crystalline nature of the CQD is highlighted by the XRD pattern, see FIG. 5.

Example 2: HgS Nanocrystal Synthesis—2 Step Synthesis

In a 50 mL three necks flask, 2 g of mercury acetate and 80 mL of oleic acid are degassed at 85° C. under vacuum for 30 min. the obtained stock solution is transparent yellowish. 4 mL of this solution are mixed with 10 mL of oleylamine and degassed at 85° C. for 30 min. Meanwhile 11 mg of Sulfur powder are dissolved by sonication in 3 mL of oleylamine. The final solution is clear and orange. Under Ar at a temperature between 60 and 120° C., the sulfur solution is injected in the flask containing the Hg precursor. The mixture immediately turns dark; the reaction is performed for 30 s to 60 min. Then 1 mL of dodecanethiol is injected to quench the reaction and the flask quickly cooled down using fresh air flow. The content of the flask was split into 50 mL tube and ethanol is added to precipitate the nanoparticle. After centrifugation for 5 min at 5000 rpm, the clear supernatant is trashed and the pellet redissolved in 10 mL clear toluene. This cleaning procedure is repeated for a second time using ethanol as non-solvent and toluene as good solvent. The pellet is again redissolved in toluene and 3 mL of acetone is added before centrifuging the solution. The formed pellet is saved and dried under nitrogen flow before being redissolved in toluene. 5 mL of ethanol is added to the supernatant which is further centrifuged to form a second pellet. The latter is also dried and redissolved in toluene. Finally 20 mL of ethanol is used to precipitate the remaining nanocrystal into the supernatant and the third fraction is further processed like the first two ones.

Example 3: HgSe Nanocrystal Synthesis—Quasi One Step

In a 25 mL three neck flask, 0.1 g of mercury acetate, 4 mL oleic acid and 10 mL oleylamine are degassed under vacuum at 85° C. for 30 min. The solution is clear and yellowish. Under Ar at the same temperature, 0.3 mL of TOPSe (1 M) is quickly injected. The solution turns dark immediately. Then 1 mL of dodecanethiol is injected to quench the reaction and the flask quickly cooled down using fresh air flow. The content of the flask was split into 50 mL tube and ethanol is added to precipitate the nanoparticle. After centrifugation for 5 min at 5000 rpm, the clear supernatant is trashed and the pellet redissolved in 10 mL clear toluene. This cleaning procedure is repeated for a second time using ethanol as non-solvent and toluene as good solvent. The pellet is again redissolved in toluene and 3 mL of acetone is added before centrifuging the solution. The formed pellet is saved and dried under nitrogen flow before being redissolved in toluene. 5 mL of ethanol is added to the supernatant which is further centrifuged to form a second pellet. The latter is also dried and redissolved in toluene. Finally 20 mL of ethanol is used to precipitate the remaining nanocrystal into the supernatant and the third fraction is further processed like the first two ones.

Example 4: Large Scale Synthesis Small HgSe Nanocrystals

Figure 6:
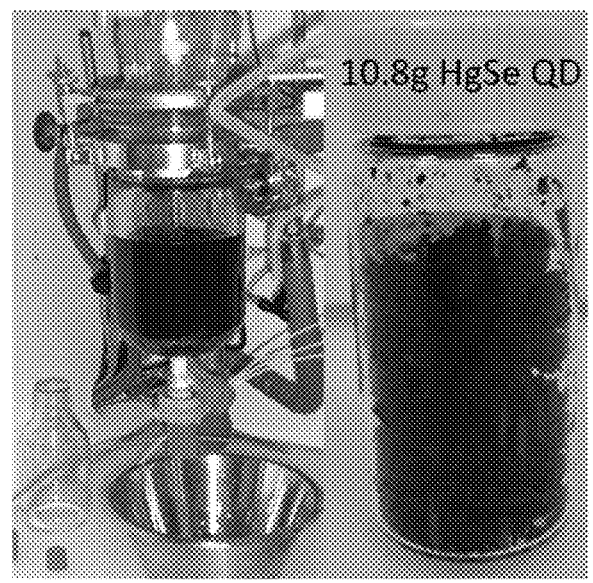
FIG. 6 represents the image of the large scale batch of small HgSe QD. More than 10 g of solid QD have been obtained with this synthesis.

In a 1 L automated reactor, 10 g of Hg(OAc)$_2$ is dissolved in 200 mL of oleic acid. The flask is degassed under vacuum for 15 min at 85° C. Then 0.5 L of oleylamine is added and the flask is further degassed at the same temperature. The atmosphere is switched to Ar and the temperature adjusted at 85° C. Meanwhile 40 mL of TOPSe (1 M) is prepared by sonicating 3.16 g of Se powder in 40 mL of trioctylphosphine (TOP). 32 mL of the TOPSe solution is quickly injected into the reactor and the whole pot turns dark. The reaction is continued for 15 min, before being quenched by addition of 5 ml of dodecantiol and 1 mL of TOP. The content of the flask is mixed with the same volume of methanol in a 2 L Erlenmeyer. The solution is then filtered. The obtained solid is further cleaned using hexane and methanol. More than 10.8 g of solid have been obtained (see FIG. 6). Final storage is done in toluene.

Example 5: Large HgSe Nanocrystals Synthesis

Figure 2:
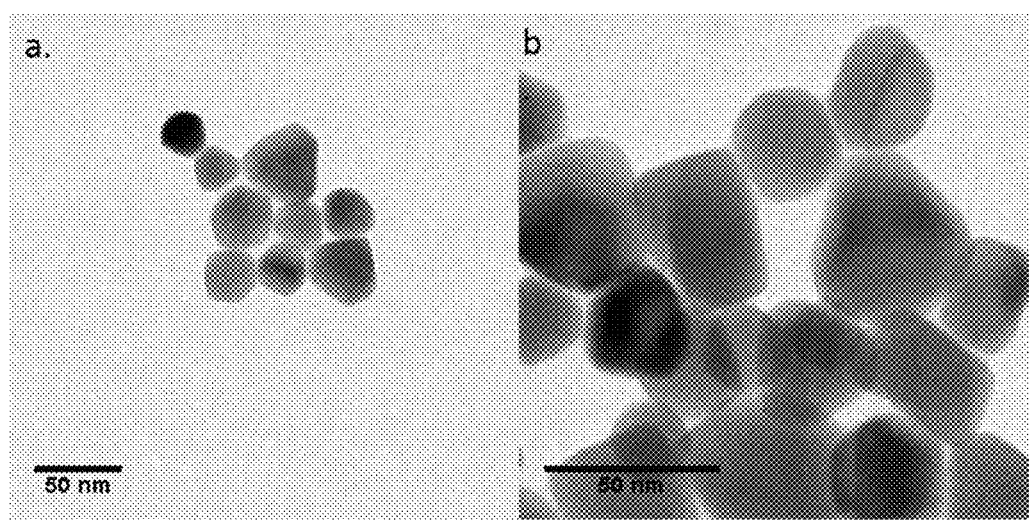
FIG. 2 represents an image of the transmission electron microscopy of large HgSe QD.

For nanocrystal larger with optical feature below 1500 cm$^{-1}$ (see FIG. 2), the following procedure has been developed. In a 25 mL three neck flask, 100 mg of Hg(OAc)$_2$ is dissolved in 4 mL of oleic acid and 10 mL of oleylamine. The flask is degassed under vacuum for 30 min at 85° C. The atmosphere is switched to Ar and the temperature adjusted between 60 and 130° C. depending on the expected final nanocrystal size. Meanwhile 0.13 g of SeS$_2$ is dissolved in 2 mL of oleylamine under sonication. The brown mixture is injected into the flask and the color turns dark. After 1 to 60 min, 1 mL of dodecanethiol is used to quench the reaction. The heating mantle is removed and the flask is cooled using a flow of fresh air. The nanocrystals are precipitated by addition of ethanol. After centrifugation the formed pellet is redissolved in toluene. The cleaning procedure is repeated two other times. Nanoparticles are stored in toluene. However due to their large size (20 nm) they have a limited colloidal stability. The obtained nanocrystals are more than 10 nm in size, see FIG. 2 and have optical feature ranging from 7 to 25 µm (at the intraband exciton peak, see FIGS. 3 and 4).

In spite of the use of a sulfur based precursor, we see no evidence of sulfur in the final compound. The X-ray diffraction present the same peak as the material obtained using the TOPSe as Se precursor (see FIG. 5). Moreover the EDS data leads to no or extremely limited (few %) sulfide content which is consistent with the thiol used as ligands. This result seems consistent with the fact that performing the synthesis of small HgSe CQD using TOPS instead of TOPSe leads to no reaction for the previously described condition.

Example 6: HgSeTe Nanocrystal Synthesis

In a 50 mL three necks flask, 2 g of mercury acetate and 80 mL of oleic acid are degassed at 85° C. under vacuum for 30 min. the obtained stock solution is transparent yellowish. 8 mL of this solution are mixed with 20 mL of oleylamine and degassed at 85° C. for 30 min. Meanwhile 1.58 g of Se powder is dissolved by sonication in 20 mL of trioctylphosphine. The final solution is clear and transparent. 1.27 g of Tellurium (Te) powder is dissolved in the glove box in 10 mL of TOP and stirred for two days, the final TOPTe solution is yellow and clear. Under Ar at 85° C., 1 mL of TOPSe is injected in the flask containing the Hg precursor. The mixture immediately turns dark. Immediately we start injecting dropwise and over 30 min the TOPTe precursor. After 30 min, 2 mL of dodecanethiol is injected to quench the reaction and the flask quickly cooled down using fresh air flow. The content of the flask was split into 50 mL tube and ethanol is added to precipitate the nanoparticle. After centrifugation for 5 min at 5000 rpm, the clear supernatant is trashed and the pellet redissolved in 10 mL clear toluene. This cleaning procedure is repeated for a second time using ethanol as non-solvent and toluene as good solvent. The pellet is again redissolved in toluene and 3 mL of acetone is added before centrifuging the solution. The formed pellet is saved and dried under nitrogen flow before being redissolved in toluene. 5 mL of ethanol is added to the supernatant which is further centrifuged to form a second pellet. The latter is also dried and redissolved in toluene. Finally 20 mL of ethanol is used to precipitate the remaining nanocrystal into the supernatant and the third fraction is further processed like the first two ones.

Example 7: HgSe—CdS Core Shell Structure

To grow a CdS shell on HgSe core nanocrystal the following procedure is used. We mix 30 mg of $Na_2S$ in 2 ml of NMFA in a 4 mL vial up to dissolution. The core are then precipitated by addition of acetonitrile to remove the excess of sulfide and redispersed in NMFA. Then 500 µl of 0.2 M cadmium acetate in NMFA are added in the vial. After the almost immediate reaction the excess of precursors is removed by precipitation of the nanocrystals with a mixture of toluene and acetonitrile (5:1). The solid obtained by centrifugation is redissolved in NMFA. The procedure is repeated 3.5 times.

Example 8: Solid State Ligand Exchange

A film of HgSe nanocrystal capped with dodecanethiol ligand is deposited by dropcasting a solution of nanocrystal dispersed into a 9:1 hexane octane mixture. The film is then dipped for 30 s in a 1% in volume solution of ethanedithiol in ethanol. The film is then rinsed in pure ethanol.

Example 8bis: Solid State Ligand Exchange

A film of HgSe nanocrystal capped with dodecanethiol ligand is deposited by dropcasting a solution of nanocrystal dispersed into a 9:1 hexane octane mixture at low concentration (0.1-0.5 mg/mL$^{-1}$). The film is then dipped for 60 s in a 0.5% in volume solution of ethanedithiol in ethanol. The film is then rinsed in pure ethanol and dried. The procedure is repeated 10 time to build a thin homogeneous film with a very limited amount of cracks.

Example 9: Solid State Ligand Exchange

A film of HgSe nanocrystal capped with dodecanethiol ligand is deposited by dropcasting a solution of nanocrystal dispersed into a 9:1 hexane octane mixture. The film is then dipped for 30 s in a 1% in volume solution of $NH_4Cl$ in ethanol. The film is then rinsed in pure ethanol.

Example 10: Solid State Ligand Exchange

A film of HgSe nanocrystal capped with dodecanethiol ligand is deposited by dropcasting a solution of nanocrystal dispersed into a 9:1 hexane octane mixture. Meanwhile $As_2S_3$ powder is mixed with short liquid amine such as propylamine or butylamine (at a 1 to 10 mg/mL concentration). The solution is sonicated to obtain clear yellow solution. This solution is diluted 10 times with acetonitrile. The nanocrystal film is dipped in this solution for 30 s and rinsed in pure ethanol. The film is finally dried using Ar flow.

Example 10bis: Solid State Ligand Exchange

A film of HgSe nanocrystal capped with dodecanethiol ligand is deposited by dropcasting a solution of nanocrystal dispersed into a 9:1 hexane octane mixture. Meanwhile Na2S or NaSH solid is mixed with ethanol at 0.5% in weight. The solution is sonicated to obtain clear solution. The nanocrystal film is dipped in this solution for 30 s and rinsed in pure ethanol. The film is finally dried using Ar flow.

Example 11: Liquid Ligand Exchange

A few mg of $Na_2S$ are dissolved in 2 mL of N-methylformamide. The solution is sonicated for 2 min. In a test tube 1 mL of the previous solution is introduced with 3 mL of HgSe QD dispersed in hexane. The solution is strongly stirred and further sonicated. A phase transfer of the nanoparticle occurred and the polar phase turns dark. The non-polar phase is then clean three times by adding hexane and let the solution settled. The clear top phase is trashed each time. Finally 3 mL of ethanol are added and the tube is centrifuged at 3000 rpm for 3 min. the liquid is trashed and the formed pellet is dried under nitrogen flow, before getting redispersed into fresh N methyl formamide.

Example 12: Liquid Ligand Exchange with $As_2S_3$

A few mg of $As_2S_3$ are dissolved into 1 mL of propylamine. The solution is sonicated for 1 min. The final solution is yellow and clear. 500 µL of this solution is then mixed with 1 mL of N methyl formamide. The solution is sonicated for 2 min. In a test tube 1 mL of the previous solution is introduced with 3 mL of HgSe QD dispersed in hexane. The solution is strongly stirred and further sonicated. A phase transfer of the nanoparticle occurred and the polar phase turns dark. The non-polar phase is then clean three times by adding hexane and let the solution settled. The clear top phase is trashed each time. Finally 3 mL of ethanol are added and the tube is centrifuged at 3000 rpm for 3 min. the liquid is trashed and the formed pellet is dried under nitrogen flow, before getting redispersed into fresh N methyl formamide.

Figure 7:
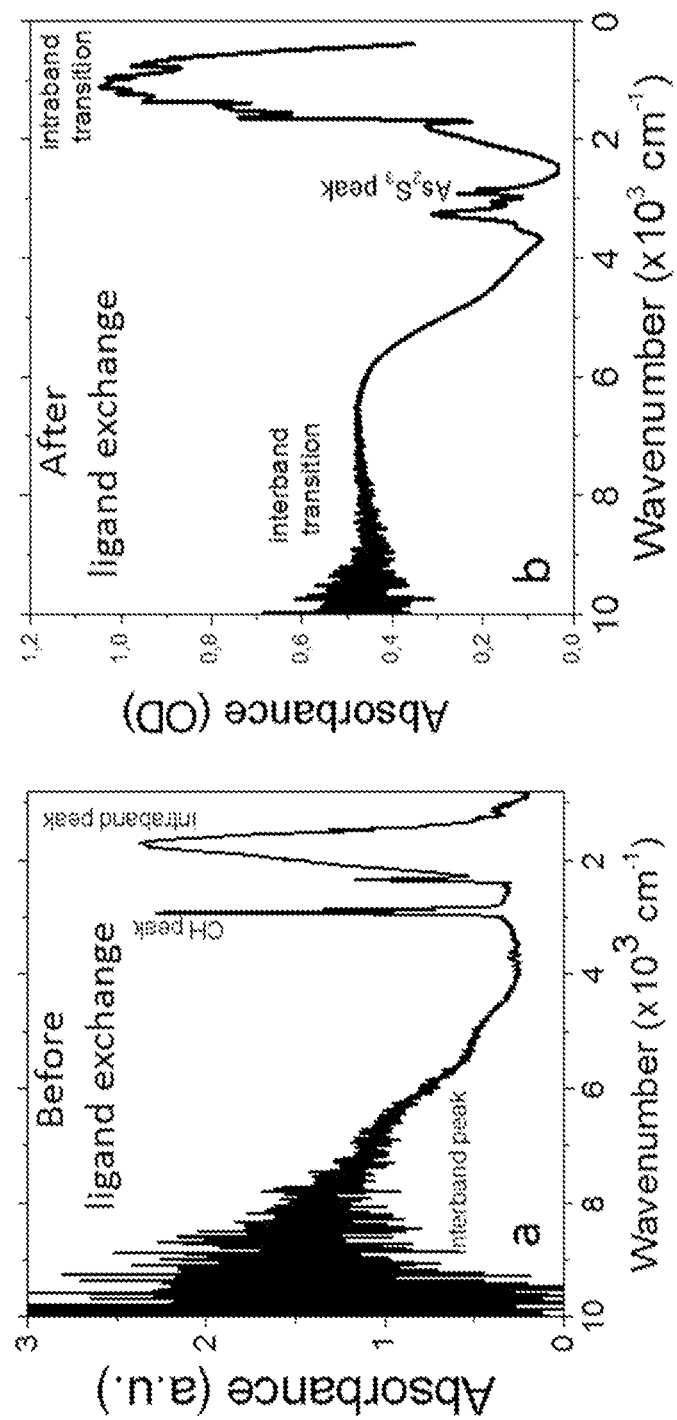
FIG. 7 a—infrared spectrum of HgSe CQD after the synthesis; b—after liquid phase ligand exchange.

The FIG. 7 shows how the infrared spectrum of HgSe CQD is affected by the ligand exchange process.

Example 13: Liquid Ligand Exchange with $Sb_2S_3$

A few mg of $Sb_2S_3$ are dissolved into 1 mL of ethylenediamine by stirring the solution for 24 h at room temperature. n. The final solution is white and bit turbid. 500 µL of this solution is then mixed with 1 mL of N methyl formamide. The solution is sonicated for 2 min. In a test tube 1 mL of the previous solution is introduced with 3 mL of HgSe QD dispersed in hexane. The solution is strongly stirred and further sonicated while heating gently the solution with a heat gun. A phase transfer of the nanoparticle occurred and the polar phase turns dark. The non-polar phase is then clean three times by adding hexane and let the solution settled. The clear top phase is trashed each time. Finally 3 mL of ethanol are added and the tube is centrifuged at 3000 rpm for 3 min. the liquid is trashed and the formed pellet is dried under nitrogen flow, before getting redispersed into fresh N methyl formamide.

Example 14: Atomic Layer Deposition (ALD) Encapsulation

A film of HgSe nanocrystal capped with dodecanethiol ligand is deposited by dropcasting a solution of nanocrystal dispersed into a 9:1 hexane octane mixture. The film is then dipped for 30 s in a 1% in volume solution of ammonia in ethanol. The film is then rinsed in pure ethanol. Then the film is introduced in the ALD setup and put under primary vacuum. The film is then sequentially exposed to flow of diethylzinc and water. Each exposition is followed by a waiting step of at least 1 min. 10 layers of the ZnO are deposited and the film is finally cooked at 70° C. for 10 min.

Example 15: Electrodes Fabrication

A n type doped silicon wafer with a 400 nm $SiO_2$ top layer, is cut into pieces of 1×1 cm2. The substrate is then rinsed by sonication into acetone for 5 min and further rinsed under isopropanol flow. Then the substrate is processed for 5 min under $O_2$ plasma. Using spin coating we deposit photosensitive resist AZ5214. The resist is further cooked under hot plate at 110° C. for 90 s. Using UV lithography mask the electrodes pattern is illuminated for 2 s. A second bake of the wafer on hot plate at 125° C. is conducted for 2 min. Then a UV flood exposure is operated for 40 s. Finally the resist is developed by dipping the film for 32 s into AZ326 developer. Then 3 nm of Cr and 40 nm of gold are deposited thanks to a thermal evaporator. Finally the lift off is conducted by dipping the substrate into acetone for 1 h, before rinsing the electrodes with isopropanol.

Example 16: Transparent and Flexible Electrodes Fabrication

Indium tin oxide (ITO) coated on polyethylene terephthalate (PET) (≈80 nm coating with a 60 Ω/cm² resistance) sheet are purchased from Sigma-Aldrich. The film is rinsed using acetone and then isopropanol before being dried. AZ 5214E resist is spin-coated and then baked for 90 s on a 110° C. hot-plate. The film is then exposed to UV for 4 s though a shadow mask. The resist is then developed for 45 s in AZ 726 and rinsed in pure water. The naked ITO is then etched using 25% HCl solution for 15 s and then quickly rinsed in pure water. The lift-off of the resist is made by dipping the substrate in acetone for 5 min and then rinsing the film with isopropanol. The designed electrodes are interdigitated electrodes with 50 µm spacing. Each electrode is itself 50 µm large and 1 mm long. The total active area is 1 mm2. A side gate electrode is also present for electrolyte gating.

Example 17: Nanotrench Fabrication

On a $Si/SiO_2$ wafer, a first electrode is prepared either using standard optical lithography or electron beam lithography. In a typical preparation AZ 5214 E resist is deposit by spin coating on the wafer. The wafer is then baked for 90 s at 110° C. A first UV exposure using the lithography mask is performed for a couple second. Then the film is further bake at 125° C. for 2 minutes. We then process to metal deposition by evaporating Ti (5 nm) and a layer of gold (54 nm) using electron evaporator. Finally the lift off is conducted by dipping the substrate into acetone for 12 h, before rinsing the electrodes with isopropanol. A second pattern is prepared using the same lithography procedure. The second metallic evaporation is made while the sample is tilted by 60° C. in order that the first electrode shadows some part of the second pattern. In this case 5 nm of Cr and 50 nm of gold are deposited. This shadow effect allows the formation of nanogap at the scale of a few tens nanometers.

Example 18: Photodetector with a Unipolar Barrier

On a $Si/SiO_2$ wafer two electrodes were designed, typically 2 mm long and spaced by 20 µm. Then one electrode is connected to a high bias DC source. The substrate face a 1 cm² glass slide coated with an indium tin oxide (ITO). This second electrode is connected to the negative side of the DC high bias voltage supply. The substrate functionalized with the two electrodes and the ITO coated electrode is dipped in a solution of CdTe NPL. A 400V voltage is applied for 30 s. We observe deposition of CdTe on the positive electrode. The substrate with the two electrodes is now dipped into a solution of $Na_2S$ in ethanol for 1 min, before being rinsed in pure ethanol. The electrodes are finally dried under air flow. The electrodes are then annealed on a hot plate for 1 h at 300° C. Then HgSe nanoparticle capped with $As_2S_3$ are dropcasted on the functionalized electrodes and heated on a hot plate in a glove box for 10 min at 100° C.

Example 19: Photoconductive Device Fabrication

In the glove box, the HgSe CQD capped with $As_2S_3$ is dropcasted on the electrode on a hot plate at 100° C.

Example 20: Electrolyte Fabrication 50 mg of $LiClO_4$ are mixed with 230 mg of PEG on a hot plate in an Ar filled glove box at 170° C. for 2 h.

Example 21: Back Gated Transistor Fabrication

In the glove box, the HgSe CQD capped with $As_2S_3$ is dropcasted on the electrode on a hot plate at 100° C. Once the film is dried, we brush pure polyethylene glycol as protective layer.

Example 22: Dual Gated Transistor Fabrication

Figure 8:
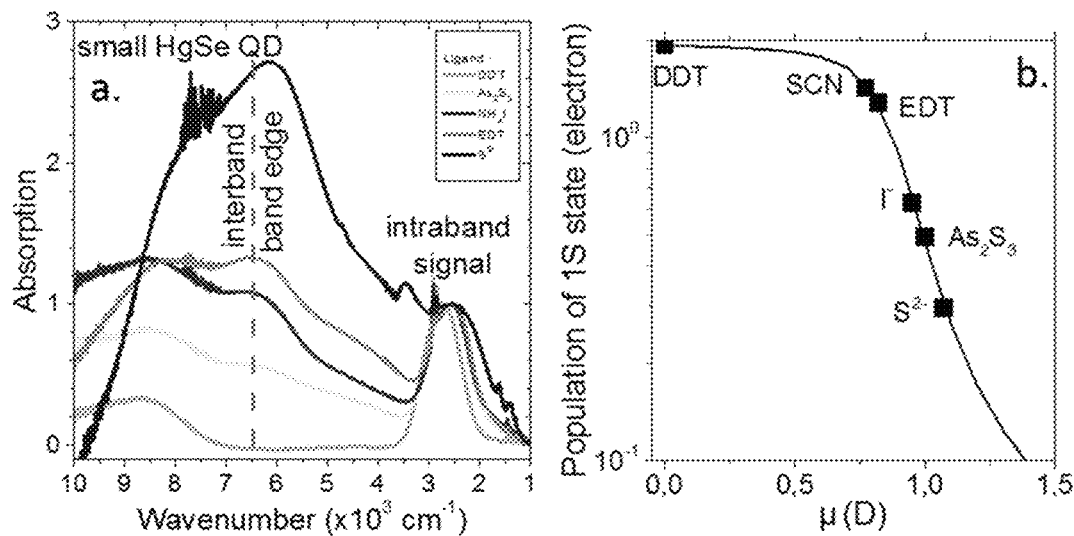
FIG. 8 is a scheme of a dual (bottom and electrolytic) gated transistor based on a thin HgSe CQD film.
Figure 8:
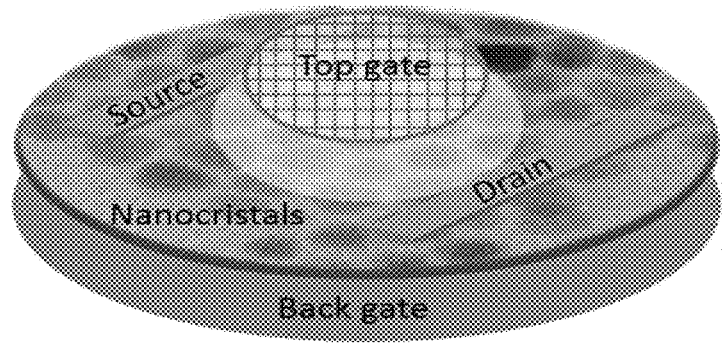
Figure 9:
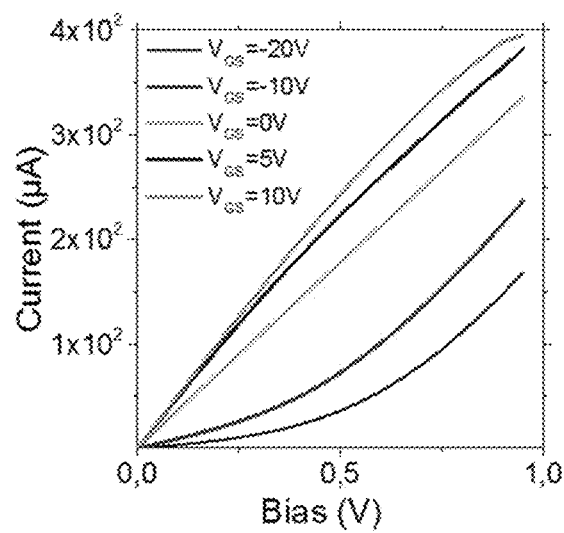
FIG. 9 represents the current as a function of voltage for a thin film of HgSe QD under different gate bias.
Figure 10:
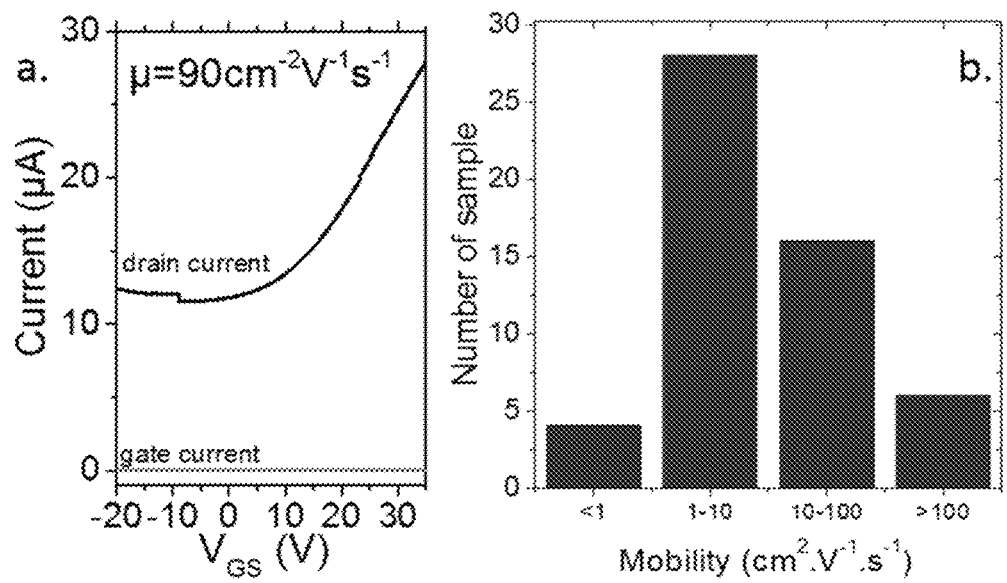
FIG. 10 illustrates a. drain current as a function of gate voltage for a transistor where the channel is made of HgSe CQD capped with $As_2S_3$ ligand. The device is operated in air at room temperature under 10 mV of drain bias. b is an histogram of the mobility estimated for a large range of film made of the same material.
Figure 11:
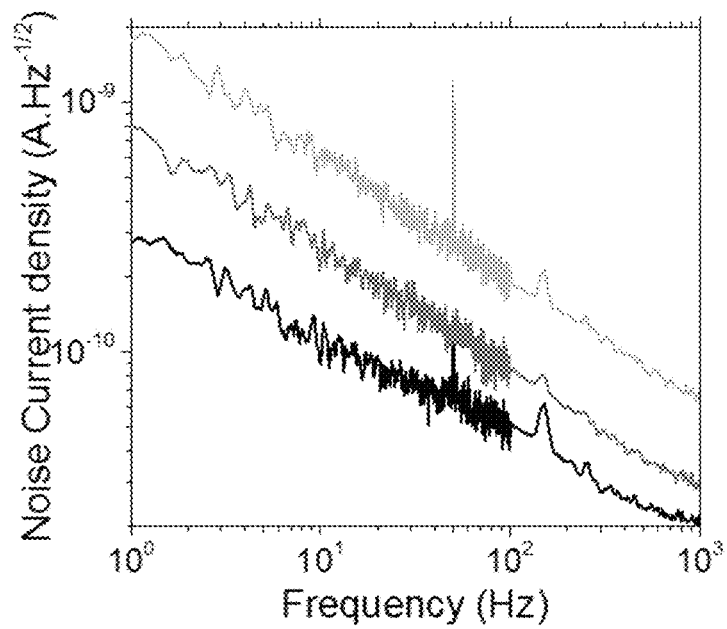
FIG. 11 represents the noise current density in thin film of HgSe QD.
Figure 12:
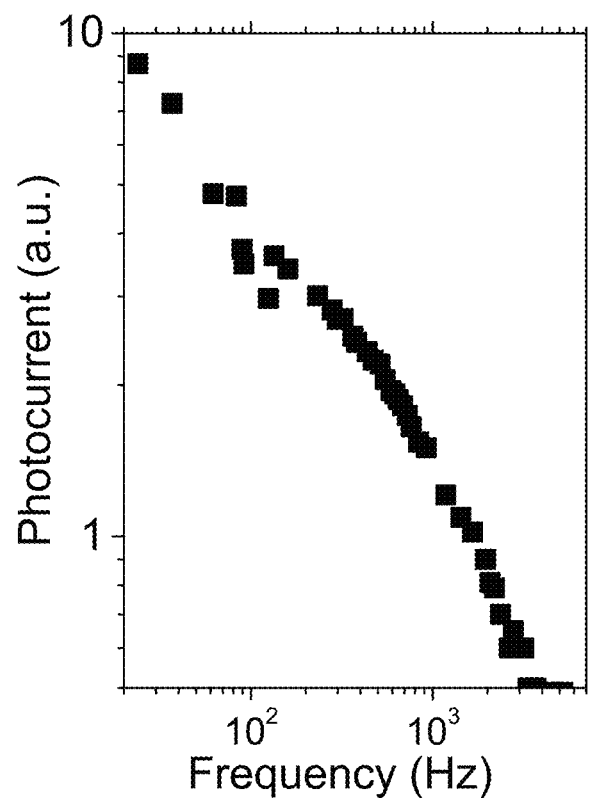
FIG. 12 represents the photo response of a thin film of HgSe QD illuminated by a 1.5 µm laser.

In the glove box, the HgSe CQD capped with $As_2S_3$ is dropcasted on the electrode on a hot plate at 100° C. Meanwhile the electrolyte is softened at 100° C. The melted electrolyte is now clear and is brushed on the CQD film. A copper grid is then deposited on the top of the electrolyte and can be used as top gate. A scheme of the device is shown on FIG. 8. Current as a function of the applied voltage of the device are given on FIG. 9. Current as a function of the applied gate bias of the device are given on FIG. 10. The noise of the device is plotted on FIG. 11. The photoresponse of the system as a function of the frequency is given on FIG. 12.

Example 23: Lithography to Design Pixel

Figure 13:
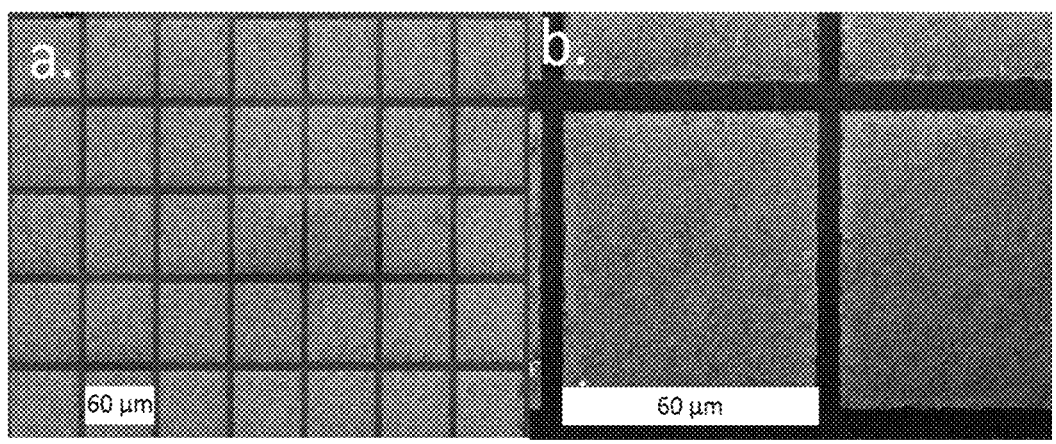
FIG. 13 represents the image the scanning electron microscopy image of pixel made out of a thin film of HgSe QD.

Films of HgSe CQD capped with $As_2S_3$ are dropcasted on a clean Doped Si wafer. The film is typically 100 nm thick. In the clean room, PMMA is spin coated and baked at 160° C. for 15 min. A 6.4 nA current and 20 kV electron acceleration is used to perform the e-beam writing. The film is developed using a Methyl isobutyl ketone (MIBK):Isopropanol (IPA) mixture and rinsed in pure isopropanol. The etching of the nanocrystal film result from an $O_2$ plasma operated for 5 min. Finally the resist is removed by dipping the film for 5 min in pure acetone. The film is further rinsed in pure IPA and dried. This method allows the design array of pixel with a 20 µm and 60 µm pitch, see FIG. 13).

The invention claimed is:

1. A plurality of metal chalcogenide nanocrystals coated with multiple organic and inorganic ligands;
wherein said metal is selected from Hg, Pb, Sn, Cd, Bi, Sb or a mixture thereof; and said chalcogen is selected from S, Se, Te or a mixture thereof;
wherein said multiple inorganic ligands comprise at least one inorganic ligand selected from $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof.

2. The plurality of metal chalcogenide nanocrystals according to claim 1, wherein the absorption of the organic ligands relative to the absorption of coated metal chalcogenide nanocrystals is lower than 50%.

3. The plurality of metal chalcogenide nanocrystals according to claim 1, wherein said plurality of metal chalcogenide nanocrystals exhibits an optical absorption feature in a range from 3 µm to 50 µm and a carrier mobility not less than 1 $cm^2V^{-1}s^{-1}$.

4. The plurality of metal chalcogenide nanocrystals according to claim 1, wherein said metal is selected from Hg or a mixture of Hg and at least one of Pb, Sn, Cd, Bi, Sb; and said chalcogen is selected from S, Se, Te or a mixture thereof; provided that said metal chalcogenide nanocrystals coated with inorganic ligands is not HgTe coated with $As_2S_3$.

5. The plurality of metal chalcogenide nanocrystals according to claim 1, wherein the inorganic ligands are $As_2Se_3$.

6. The plurality of metal chalcogenide nanocrystals according to claim 1, wherein said metal chalcogenide nanocrystals are doped.

7. A method for manufacturing a plurality of metal chalcogenide nanocrystals according to claim 1, said method comprising the following steps:
providing a metal carboxylate in a coordinating solvent;
admixing within said solution a chalcogenide precursor at a temperature ranging from 60° C. to 130° C.;
isolating the metal chalcogenide nanocrystals; and
coating the isolated metal chalcogenide nanocrystals with multiple inorganic ligands.

8. The method for manufacturing colloidal metal chalcogenide nanocrystals according to claim 7, wherein the metal carboxylate is a metal oleate or a metal acetate.

9. The method for manufacturing colloidal metal chalcogenide nanocrystals according to claim 7, wherein the coordinating solvent is selected from a primary amine.

10. The method for manufacturing colloidal metal chalcogenide nanocrystals according to claim 7, wherein the primary amine is oleyamine, hexadecylamine or octadecylamine.

11. The method for manufacturing colloidal metal chalcogenide nanocrystals according to claim 7, wherein the chalcogenide precursor is selected from trioctylphosphine chalcogenide, trimethylsilyl chalcogenide or disulfide chalcogenide.

12. The method for manufacturing colloidal metal chalcogenide nanocrystals according to claim 7, wherein isolating the metal chalcogenide nanocrystals comprises admixing a thiol and/or a phosphine with the nanocrystals; thereby forming a quenched mixture; and then extracting the nanocrystals from the quenched mixture.

13. The method for manufacturing colloidal metal chalcogenide nanocrystals according to claim 7 further comprising the step of maintaining the mixture at a temperature ranging from 60° C. to 130° C. during a predetermined duration ranging from 1 to 60 minutes after injection of the chalcogenide precursor.

14. The method for manufacturing colloidal metal chalcogenide nanocrystals according to claim 7, wherein said multiple inorganic ligands comprise at least one inorganic ligand selected from $S^{2-}$, $HS^-$, $Se^{2-}$, $Te^{2-}$, $OH^-$, $BF_4^-$, $PF_6^-$, $Cl^-$, $Br^-$, $I^-$, $As_2Se_3$, $Sb_2S_3$, $Sb_2Te_3$, $Sb_2Se_3$, $As_2S_3$ or a mixture thereof.

15. A photoconductor, photodiode or phototransistor comprising:
a photoabsorptive layer comprising a plurality of metal chalcogenide nanocrystals according to claim 1; and
a first plurality of electrical connections bridging the photoabsorptive layer;
wherein
the plurality of metal chalcogenide nanocrystals are positioned such that there is an increased conductivity between the electrical connections and across the photoabsorptive layer, in response to illumination of the photoabsortive layer with light at a wavelength ranging from 3 µm to 50 µm;
the carrier mobility is not less than 1 $cm^2V^{-1}s^{-1}$.

16. The photoconductor, photodiode or phototransistor according to claim 15, wherein the photoabsorptive layer has a thickness ranging from 3 nm to 1 mm.

17. The photoconductor, photodiode or phototransistor according to claim 15, wherein the photoabsorptive layer has an area ranging from 100 $nm^2$ to 1 $m^2$.

18. A device comprising a plurality of photoconductors, photodiodes or phototransistors according to claim 15; and a readout circuit electrically connected to the plurality of photoconductors, photodiodes or phototransistors.

19. An IR-absorbing coating material comprising metal chalcogenide nanocrystals according to claim 1.

20. A bolometer or a pyrometer comprising metal chalcogenide nanocrystals according to claim 1.

21. The plurality of metal chalcogenide nanocrystals according to claim 1, wherein said plurality of metal chalcogenide nanocrystals exhibits an optical absorption feature in a range from 0.8 µm to 25 µm.

\* \* \* \* \*